(12) United States Patent
Suh et al.

(10) Patent No.: US 7,397,450 B2
(45) Date of Patent: *Jul. 8, 2008

(54) IMAGE DISPLAY AND DISPLAY PANEL THEREOF

(75) Inventors: Mi-Sook Suh, Suwon-si (KR); Keum-Nam Kim, Suwon-si (KR)

(73) Assignee: Samsung SDI Co., Ltd., Suwon-si (KR)

( * ) Notice: Subject to any disclaimer, the term of this patent is extended or adjusted under 35 U.S.C. 154(b) by 452 days.

This patent is subject to a terminal disclaimer.

(21) Appl. No.: 10/942,320

(22) Filed: Sep. 16, 2004

(65) Prior Publication Data

US 2005/0083271 A1    Apr. 21, 2005

(30) Foreign Application Priority Data

Sep. 16, 2003    (KR)    .................. 10-2003-0064105

(51) Int. Cl.
*G09G 3/30*    (2006.01)
(52) U.S. Cl. .................. 345/76; 345/82; 345/204; 315/169.3
(58) Field of Classification Search ............. 345/76–83, 345/87–103, 204–205, 208–210; 315/169.1, 315/169.3; 348/800–803
See application file for complete search history.

(56) References Cited

U.S. PATENT DOCUMENTS

| | | | |
|---|---|---|---|
| 5,426,447 A | 6/1995 | Lee | |
| 5,510,807 A | 4/1996 | Lee et al. | |
| 5,686,936 A | 11/1997 | Maekawa et al. | |
| 5,708,454 A | 1/1998 | Katoh et al. | |
| 6,229,506 B1 | 5/2001 | Dawson et al. | |
| 6,229,508 B1 | 5/2001 | Kane | |
| 6,362,798 B1 | 3/2002 | Kimura et al. | |
| 6,369,786 B1 | 4/2002 | Suzuki | |
| 6,469,318 B2 | 10/2002 | Yamada et al. | |
| 6,501,448 B1 | 12/2002 | Komiya et al. | |
| 6,580,408 B1 | 6/2003 | Bae et al. | |
| 6,650,060 B2 | 11/2003 | Okuda | |
| 6,731,266 B1 | 5/2004 | Jung | |
| 6,760,005 B2 | 7/2004 | Koyama et al. | |
| 6,791,129 B2 | 9/2004 | Inukai | |
| 6,809,482 B2 | 10/2004 | Koyama | |

(Continued)

FOREIGN PATENT DOCUMENTS

CN    1361510 A    7/2002

(Continued)

*Primary Examiner*—Henry N Tran
(74) *Attorney, Agent, or Firm*—Christie, Parker & Hale, LLP

(57) ABSTRACT

An image display and a display panel. The display panel includes data lines for transmitting a data signal corresponding to video signals, scan lines for transmitting select signals, and pixel circuits formed in pixel regions defined by two neighboring data lines and scan lines. The pixel circuit includes a display element and a first transistor having a capacitor coupled between main and control electrodes thereof. The first transistor outputs a current corresponding to the voltage between the main and control electrodes. A second transistor has a control electrode coupled to the control electrode of the first transistor. A first switch delivers the data signal from the data lines to the second transistor in response to the select signal from the current scan line.

19 Claims, 11 Drawing Sheets

U.S. PATENT DOCUMENTS

| | | |
|---|---|---|
| 6,859,193 B1 | 2/2005 | Yumoto |
| 6,989,826 B2 * | 1/2006 | Kasai .................. 345/204 |
| 7,015,884 B2 | 3/2006 | Kwon |
| 7,224,334 B2 | 5/2007 | Choi et al. |
| 2002/0047581 A1 | 4/2002 | Koyama |
| 2002/0118150 A1 | 8/2002 | Kwon |
| 2003/0179164 A1 | 9/2003 | Shin et al. |
| 2004/0041769 A1 | 3/2004 | Yamashita et al. |
| 2004/0217925 A1 | 11/2004 | Chung et al. |

FOREIGN PATENT DOCUMENTS

| | | |
|---|---|---|
| EP | 0 905 673 A1 | 3/1999 |
| EP | 1 220 191 A2 | 7/2002 |
| EP | 1 220 191 A3 | 9/2003 |
| JP | 02082295 A | 3/1990 |
| JP | 11-272233 | 10/1999 |
| JP | 2002-351401 | 12/2002 |
| JP | 2004-118196 | 4/2004 |
| WO | WO 01/0648 A1 | 1/2001 |

* cited by examiner

IMAGE DISPLAY AND DISPLAY PANEL THEREOF

CROSS REFERENCE TO RELATED APPLICATION

This application claims priority to and the benefit of Korea Patent Application No. 2003-64105 filed on Sep. 16, 2003 in the Korean Intellectual Property Office, the entire content of which is incorporated herein by reference.

BACKGROUND OF THE INVENTION (a) Field of the Invention

The present invention relates to an image display and a display panel thereof. More specifically, the present invention relates to an organic electroluminescent (EL) display.

(b) Description of the Related Art

In general, an organic EL display is a display that emits light by electrical excitation of fluorescent organic compound and displays images by driving each of N×M organic luminescent cells with voltages or current. The organic cell has a structure of an anode (ITO), an organic thin film, and a cathode layer (metal). The organic thin film is formed as a multi-layered structure including an emission layer ("EML"), an electron transport layer ("ETL") and a hole transport layer ("HTL") so as to increase luminescence efficiency by balancing electron and hole concentrations. In addition, it can include an electron injection layer ("EIL") and a hole injection layer ("HIL") separately.

Organic EL displays that use organic luminescent cells such as the above are configured as a passive matrix or an active matrix that includes thin film transistors (TFTs). In the passive matrix configuration, organic luminescent cells are formed between anode and cathode lines that cross each other and are driven by driving those lines. In the active matrix configuration, a TFT and a capacitor are coupled to each ITO pixel electrode to maintain voltage using capacitance. Here, the active matrix type organic EL display displays images according to a voltage programming method and a current programming method that are dependent on the form of a signal applied to maintain the voltage in the capacitor.

In the voltage programming method, data voltages representing gray scales are supplied to a pixel circuit to display an image. This voltage programming method has a problem of unevenness due to a variation in threshold voltages and electron mobilities of driving transistors. In the current programming method, data current representing gray scales is provided to the pixel circuit to display an image. The current programming method can solve the unevenness problem. However, the current programming cannot properly secure a charging time for charging loads of data lines because it should control organic EL devices with a small quantity of current.

An example of the pixel circuit for compensating a threshold voltage of a driving transistor in the voltage programming method is disclosed in U.S. Pat. No. 6,362,798 by Mutsumi et al. This pixel circuit compensates the threshold voltage of the driving transistor using a mirror transistor whose gate is coupled to the gate of the driving transistor.

In the image display having the pixel circuit that compensates the threshold voltage of the driving transistor using the mirror transistor, i.e., the pixel circuit using two mirror-type transistors, the transistors must have the same characteristics. In a conventional method of manufacturing such image display device, an Eximer laser (ELA) is used. FIG. 1 shows the traveling direction of an Eximer laser used to manufacture the conventional image display device.

For the case where R, G, and B pixels are arranged on the same line to form a pixel, as shown in FIG. 1, two mirror-type transistors are arranged in such a manner that the channel directions of the two transistors are parallel with the traveling direction of the Eximer laser in each pixel. Further, the Eximer laser is irradiated on each pixel with its traveling direction being parallel with a longer side of each pixel. Here, the same Eximer laser beam is not irradiated on the R, G, and B pixels, but different Eximer laser beams are irradiated on them as shown in FIG. 1. This makes the driving transistors of the R, G, and B pixels have different characteristics, thereby resulting in unevenness of luminance.

SUMMARY OF THE INVENTION

In exemplary embodiments of the present invention, an appropriate ELA direction is established so that the light emitting display device may have a uniform threshold voltage.

Further, luminance uniformity of each pixel in an image display may be improved using two mirror-type transistors.

In an exemplary embodiment of the present invention, a display panel includes a plurality of data lines for transmitting a data signal corresponding to a video signal, a plurality of scan lines for transmitting a select signal, and a plurality of pixel circuits each of which is formed in a pixel region defined by two neighboring data lines and two neighboring scan lines. Each of the pixel circuits includes a display element for displaying an image corresponding to an amount of current applied thereto. Each pixel circuit also includes a first transistor having a capacitor coupled between a main electrode and a control electrode thereof. The first transistor outputs the current applied to the display element, the amount of the current corresponding to a voltage between the main electrode and the control electrode thereof. Each pixel circuit also includes a second transistor whose control electrode is coupled to the control electrode of the first transistor, the second transistor being diode-connected. A first switching element is coupled to a main electrode of the second transistor, wherein the first switching element delivers the data signal from the data lines to the second transistor in response to the select signal from a current said scan line. The channels of the first and second transistors are formed elongated in a direction substantially parallel to the scan lines.

In another exemplary embodiment of the present invention, channels of the first and second transistors are formed elongated in a direction substantially parallel to a shorter one of vertical and horizontal sides of the pixel region.

In yet another exemplary embodiment of the present invention, an image display includes the display panel constructed as above; a data driver applying the data signal to the data lines and a scan driver applying the select signal to the scan lines. The channels of the first and second transistors are formed elongated in a direction substantially parallel to the scan lines.

In still another exemplary embodiment of the present invention, channels of the first and second transistors are formed substantially parallel to the scan lines such that an Eximer laser beam can be irradiated to form the first transistors and the second transistors of the red, green and blue pixel circuits when irradiated in a direction substantially parallel to the scan lines.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION

In the following detailed description, only certain exemplary embodiments of the present invention are shown and described, simply by way of illustration. As those skilled in the art would recognize, the described exemplary embodiments may be modified in various different ways, all without departing from the spirit or scope of the present invention. Accordingly, the drawings and description are to be regarded as illustrative in nature, and not restrictive. Connection of a certain part to another part may indicate that the two parts are directly coupled to each other, or that the two parts are coupled to each other through another part interposed between them.

Figure 1:
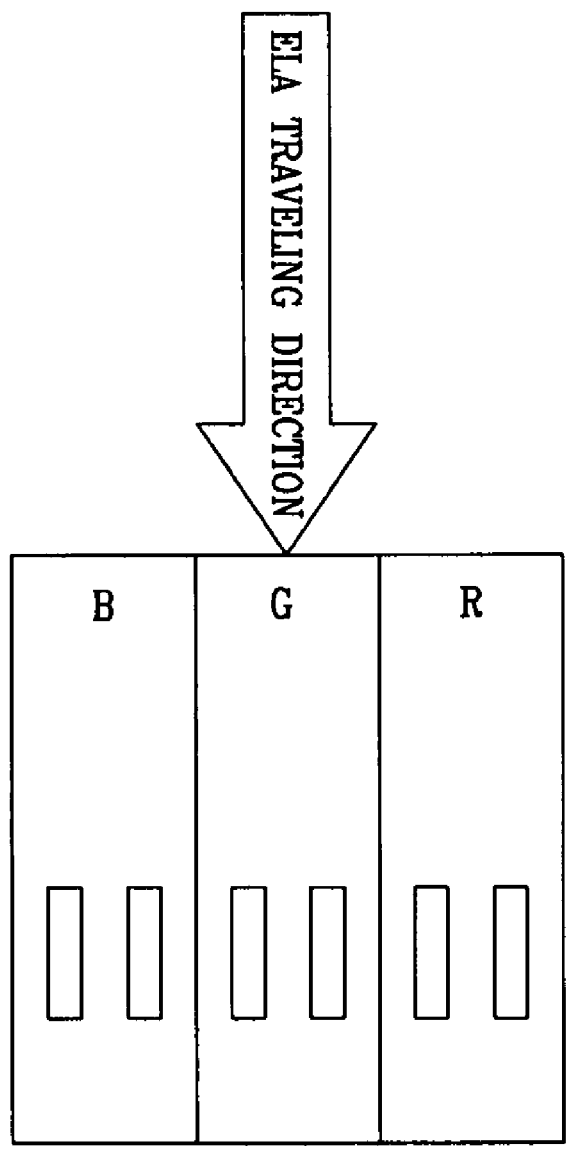
FIG. 1 shows the direction of an Eximer laser used to manufacture a conventional image display.
Figure 2:
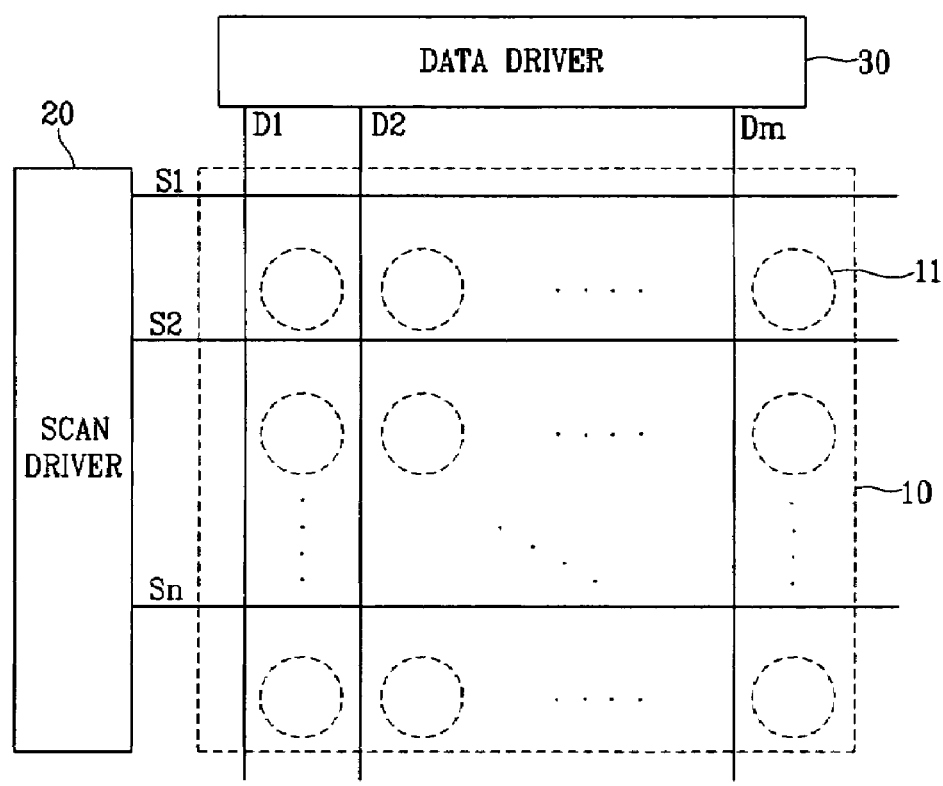
FIG. 2 is a plan view of an image display according to an exemplary embodiment of the present invention.

An organic EL display according to an exemplary embodiment of the present invention is explained first with reference to FIG. 2, which shows a plan view of the organic EL display according to the present invention.

As shown in FIG. 2, the organic EL display in an exemplary embodiment of the present invention includes an organic EL display panel 10, a scan driver 20, and a data driver 30. The organic EL display panel 10 has a plurality of data lines D1 to Dm each extending in a column direction and arranged in a row direction, a plurality of scan lines S1 to Sn each extending in a row direction and arranged in a column direction, and a plurality of pixel circuits 11. The data lines D1 to Dm deliver a data voltage corresponding to a video signal to the pixel circuits 11, while the scan lines S1 to Sn transmit a select signal for selecting specific pixel circuits to the pixel circuits 11. Each pixel circuit 11 is formed in a pixel region defined by two neighboring data lines and two neighboring scan lines.

The scan driver 20 sequentially applies the select signal to the scan lines S1 to Sn. The data driver 30 applies the data voltage corresponding to a video signal to the data lines D1 to Dm.

The scan driver 20 and/or the data driver 30 may be coupled to the display panel 10, or mounted in the form of a chip on a tape carrier package (TCP) that is attached to the display panel 30 and coupled thereto. Further, they may be mounted in the form of a chip on a flexible printed circuit (FPC) or film that is attached to the display panel 30 and coupled thereto, which is called COF (chip on flexible board or chip on film). In other embodiments, the scan driver 20 and/or the data driver 30 may be directly mounted on the glass substrate of the display panel or replaced with a driving circuit formed of the same layers as those of the scan lines, data lines, and thin film transistors on the glass substrate, which is called COG (chip on glass).

Figure 3:
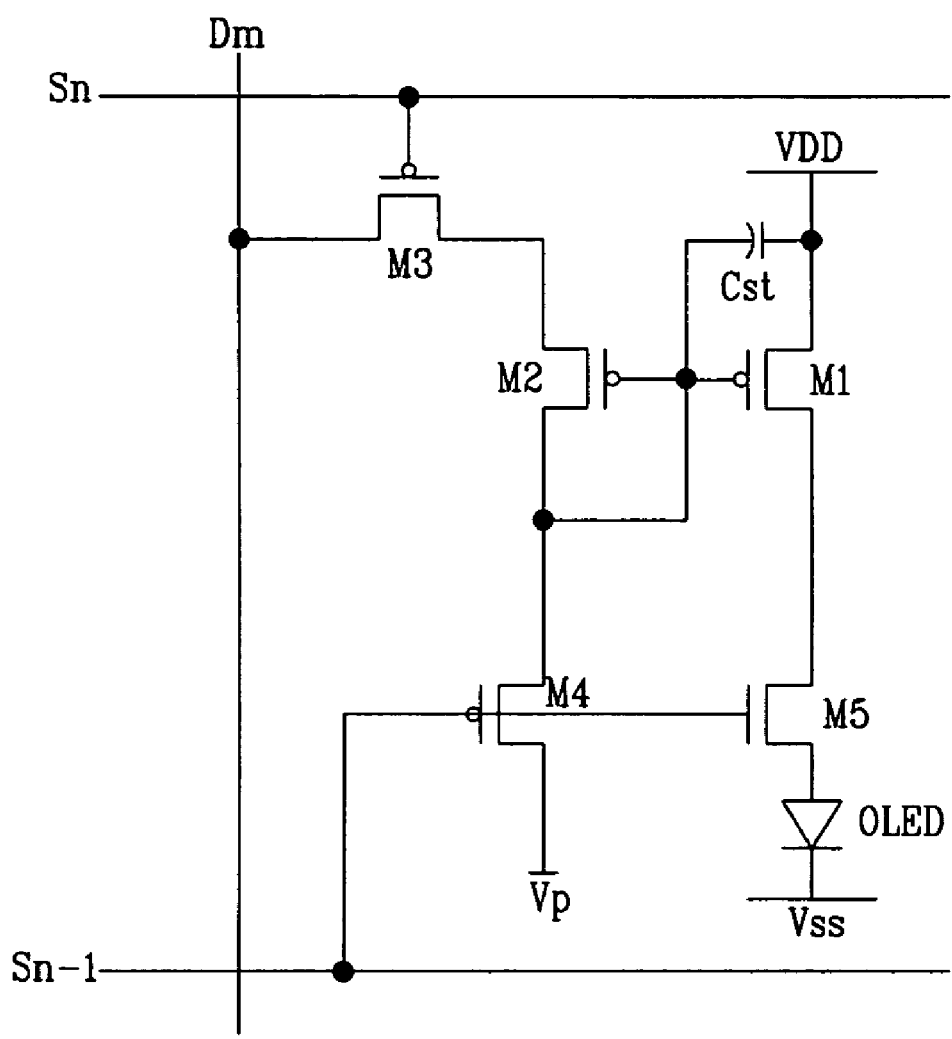
FIG. 3 is an equivalent circuit diagram of a pixel circuit according to a first exemplary embodiment of the present invention.

Next, the pixel circuit 11 of the organic EL display according to a first embodiment of the present invention is explained in more detail. FIG. 3 is an equivalent circuit diagram of the pixel circuit according to the first exemplary embodiment of the present invention. FIG. 3 shows only the pixel circuit coupled to the mth data line Dm, the nth scan line Sn and the (n−1)th scan line Sn−1 for convenience of explanation.

The scan line that delivers the current select signal is called the "current scan line", and the scan line that has transmitted the previous select signal before the current select signal is delivered is called the "previous scan line". Hence, the scan line Sn of FIG. 3 may be referred to as the current scan line, while the scan line Sn−1 may be referred to as the previous scan line.

As shown in FIG. 3, the pixel circuit 11 according to the first exemplary embodiment of the present invention includes an organic EL element OLED, transistors M1 to M5, and a capacitor Cst. The transistors M1 to M4 are PMOS transistors and the transistor M5 is an NMOS transistor. Each of these transistors M1 to M5 is a thin film transistor that has gate, drain, and source electrodes formed on the glass substrate of the display panel 10 as a control electrode, and two main electrodes.

The driving transistor M1 has its source coupled to a power supply voltage VDD. The capacitor Cst is coupled between the gate and the source of the driving transistor M1. The capacitor Cst maintains the gate-source voltage VGS of the transistor M1 for a predetermined period of time. The compensating transistor M2 is diode-connected, and its gate is coupled to the gate of the driving transistor M1. The switching transistor M3 transmits the data voltage from the data line Dm to the transistor M2 in response to a select signal from the current scan line Sn. The transistor M4 is coupled to the drain of the transistor M2, and delivers a pre-charge voltage Vp to the transistor M2 in response to a select signal from the previous scan line Sn−1.

The transistor M5 is coupled between the drain of the transistor M1 and the anode of the organic EL element OLED to electrically isolate the transistor M1 from the organic EL element OLED in response to the select signal from the previous scan line Sn−1. The organic EL element OLED whose cathode is coupled to a reference voltage Vss emits light corresponding to a current applied thereto. The reference voltage Vss is lower than the power supply voltage VDD. Ground voltage can be used as the reference voltage, for example.

When manufacturing an image display using the compensating transistor for compensating the threshold voltage of the driving transistor according to an exemplary embodiment of the present invention as described above, that is, an image display having two mirror-type transistors, the pixels are arranged as follows.

Figure 4:
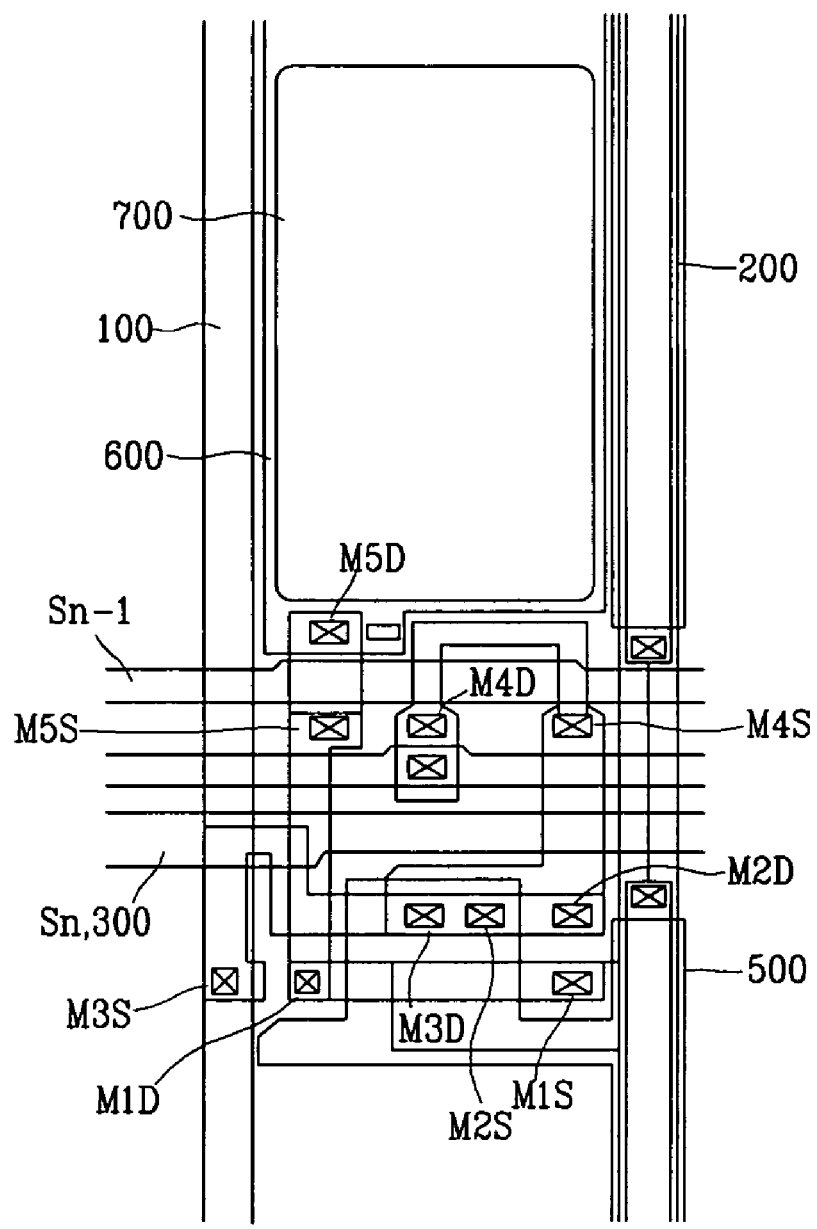
FIG. 4 shows a layout of an image display according to the first exemplary embodiment of the present invention.
Figure 5:
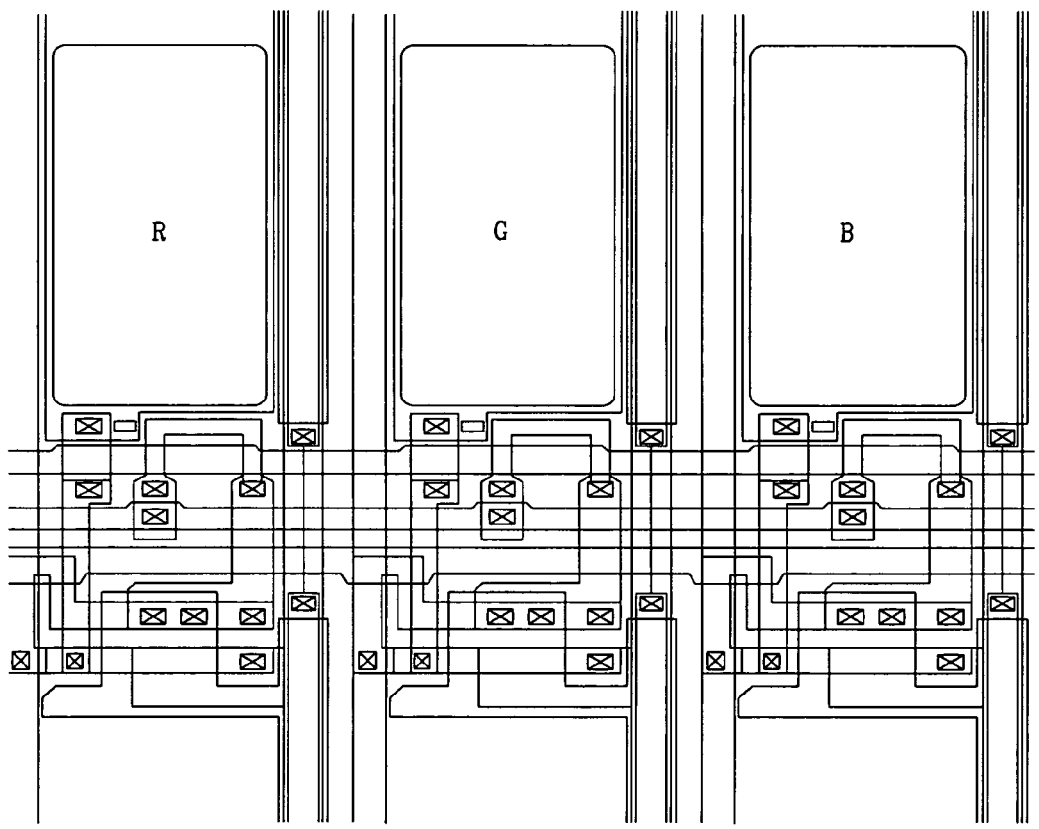
FIG. 5 shows a layout of R, G, and B pixels, each of which has the layout structure of FIG. 4.

FIG. 4 shows a layout of an image display according to the first exemplary embodiment of the present invention, and FIG. 5 shows a layout of R, G, and B pixels, each of which has the layout structure of FIG. 4.

Referring to FIGS. 4 and 5, a data line 100 is formed in a vertical direction and a power supply line 200 is arranged substantially in parallel with the data line 100. The data line 100 and the power supply line 200 are formed as a pair at each pixel. A first scan line 300 (Sn) is formed in a horizontal direction, being substantially perpendicular to the data line 100, and a second scan line Sn−1 is formed substantially in parallel with the first scan line Sn.

A part of the data line 100 forms the source electrode M3S of the switching transistor M3. The drain electrode M3D of the switching transistor is formed opposite to the source electrode M3S, and the gate electrode thereof is formed by the first scan line Sn. The source electrode M2S of the compensating transistor M2 is coupled to the drain electrode M3D of the switching transistor M3. The drain electrode M2D of the compensating transistor M2 is coupled to the source electrode M4S of the transistor M4. The drain electrode M4D of the transistor M4 is formed on the same line (parallel with the scan lines) as the source electrode M4S. The gate electrode of the transistor M4 is formed by the second scan line Sn−1. The source and drain electrodes M5S and M5D of the transistor M5 are respectively formed at both sides of the second scan line Sn−1, and the gate electrode thereof is formed by the second scan line Sn−1. The drain electrode M5D of the transistor M5 is coupled to a pixel electrode 600 through a contact hole. A planarization layer is formed on the pixel electrode 600, and an organic EL element layer 700 is formed thereon.

The drain electrode M1D of the driving transistor M1 is coupled to the source electrode M5S of the transistor M5, and the source electrode M1S of the driving transistor M1 is formed of a part of the power supply line 200. The channel between the drain and source electrodes M1D and M1S is formed in parallel with the first scan line Sn. The gate channel of the driving transistor M1 is coupled to a sustain electrode line 500 for forming the capacitor.

Also, the channel between the source and drain electrodes M2S and M2D is formed from a semiconductor layer in parallel with the first scan line Sn.

As described above, according to the first exemplary embodiment of the present invention, the channels of the mirror-type compensating transistor M2 and driving transistor M1 are formed in parallel with the scan lines so that the compensating transistor M2 and the driving transistor M1 of each of R, G, and B pixels are located on the same line.

Next, the operation of the pixel circuit having the layout structure as described above according to the first exemplary embodiment of the present invention is explained in detail.

Figure 6:
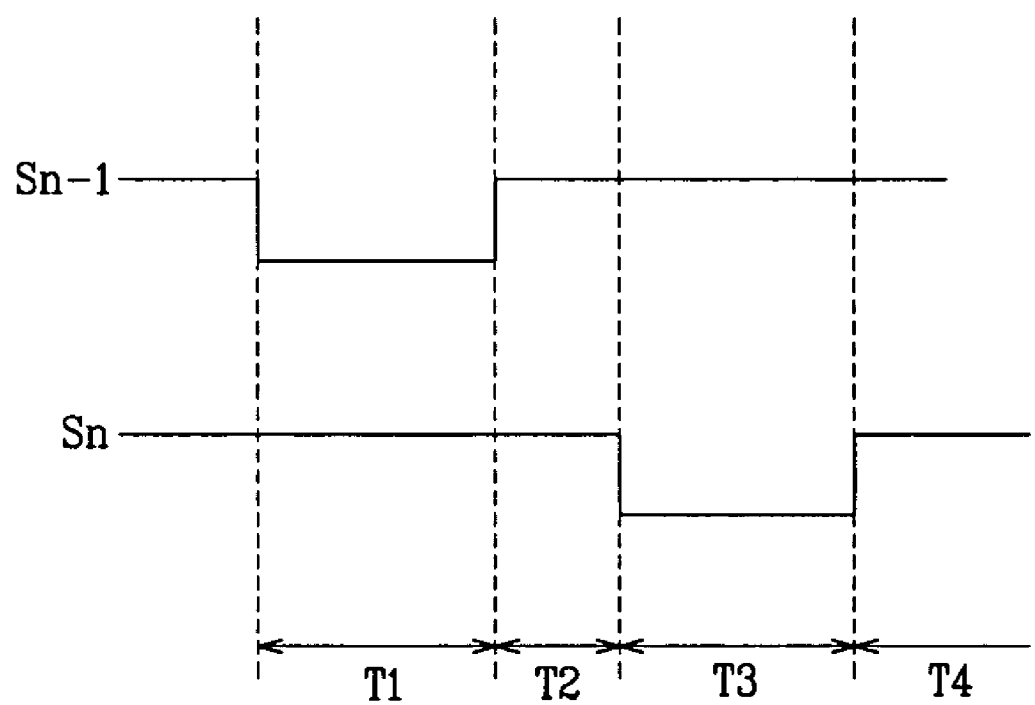
FIG. 6 is a diagram showing waveforms for driving the pixel circuit of FIG. 3.

FIG. 6 is a diagram showing waveforms for driving the pixel circuit of FIG. 3. Referring to FIG. 6, during a pre-charge time period T1, the select signal from the previous scan line Sn−1 becomes a low level so that the transistor M4 is turned on while the transistor M5 is turned off. A pre-charge voltage Vp is transmitted to the gate of the transistor M1 through the turned on transistor M4. Here, the pre-charge voltage Vp should be slightly lower than a voltage that is applied to the gate of the transistor in order to reach a maximum gray level, that is, a minimum data voltage applied through the data line Dm. In doing so, the data voltage is always higher than the gate voltage of the transistor M1 when it is applied through the data line Dm. In other words, the transistor M1 is coupled in a forward direction so that the data voltage can be charged in the capacitor Cst.

At this time, the gate-source voltage $V_{GS}$ of the transistor M1 increases according to the pre-charge voltage Vp such that a large current flowing through the transistor M1 can be generated. If this large current is supplied to the organic EL element OLED, the organic EL element OLED emits light so that black gray cannot be accurately displayed when it is required. According to the first exemplary embodiment of the present invention, however, the transistor M1 and organic EL element OLED are electrically isolated from each other because of the turned-off transistor M5 so that the pre-charge voltage Vp does not cause a current to flow. Thus, black gray can be accurately presented and consumption power can be reduced because unnecessary current is prevented from flowing.

During a blanking interval T2, the select signal from the previous scan line Sn−1 becomes a high level signal while the select signal from the current scan line Sn is being maintained at the high level. The data voltage from the data line Dm is converted into a data voltage corresponding to the pixel circuit coupled to the previous scan line Sn during the blanking interval T2. The data voltage from the data line Dm should be changed into a data voltage to be applied to the actual pixel circuit. If there is no blanking interval T2, in the case that the select signal from the current scan line Sn becomes low level before the current data voltage is applied, the previous data voltage that has been applied to the data line Dm would be transmitted to the transistor M1 through the transistor M3.

During a data charging period T3, the select signal from the current scan line Sn becomes low level so that the transistor M3 is turned on. Then, the data voltage from the data line Dm is delivered to the transistor M2 through the transistor M3. Because the transistor M2 is diode-connected, a voltage corresponding to the difference between the data voltage and threshold voltage $V_{TH2}$ of the transistor M2 is applied to the gate of the transistor M1. This voltage is charged in the capacitor Cst and maintained for a predetermined period of time. The select signal from the previous scan line Sn−1 has the high level so that the transistor M2 is turned on.

During a light-emitting period T4, current $I_{OLED}$ corresponding to the gate-source voltage $V_{GS}$ of the transistor M1 is supplied to the organic EL element OLED so that the organic EL element emits light. This current $I_{OLED}$ is represented as follows.

$$I_{OLED} = \frac{\beta}{2}(|V_{GS}| - |V_{TH1}|)^2 = \frac{\beta}{2}(V_{DD} - (V_{DATA} - |V_{TH2}|) - |V_{TH1}|)^2 \quad \text{[Equation 1]}$$

where $V_{TH1}$ is the threshold voltage of the transistor M1, $V_{DATA}$ is the data voltage from the data line Dm, and β is a constant value. Here, if the threshold voltage $V_{TH1}$ of the transistor M1 is identical to the threshold voltage $V_{TH2}$ of the transistor M2, the current $I_{OLED}$ is represented by the following equation.

$$I_{OLED} = \frac{\beta}{2}(V_{DD} - V_{DATA})^2 \quad \text{[Equation 2]}$$

Accordingly, current corresponding to the data voltage applied through the data line Dm flows through the organic EL element OLED irrespective of the threshold voltage $V_{TH1}$ of the transistor M1.

As described above, according to the first exemplary embodiment of the present invention, a variance in the threshold voltage of the driving transistor M1 can be compensated. Furthermore, it is possible to block current that may flow to the organic EL element OLED in response to the pre-charge voltage Vp.

Figure 7:
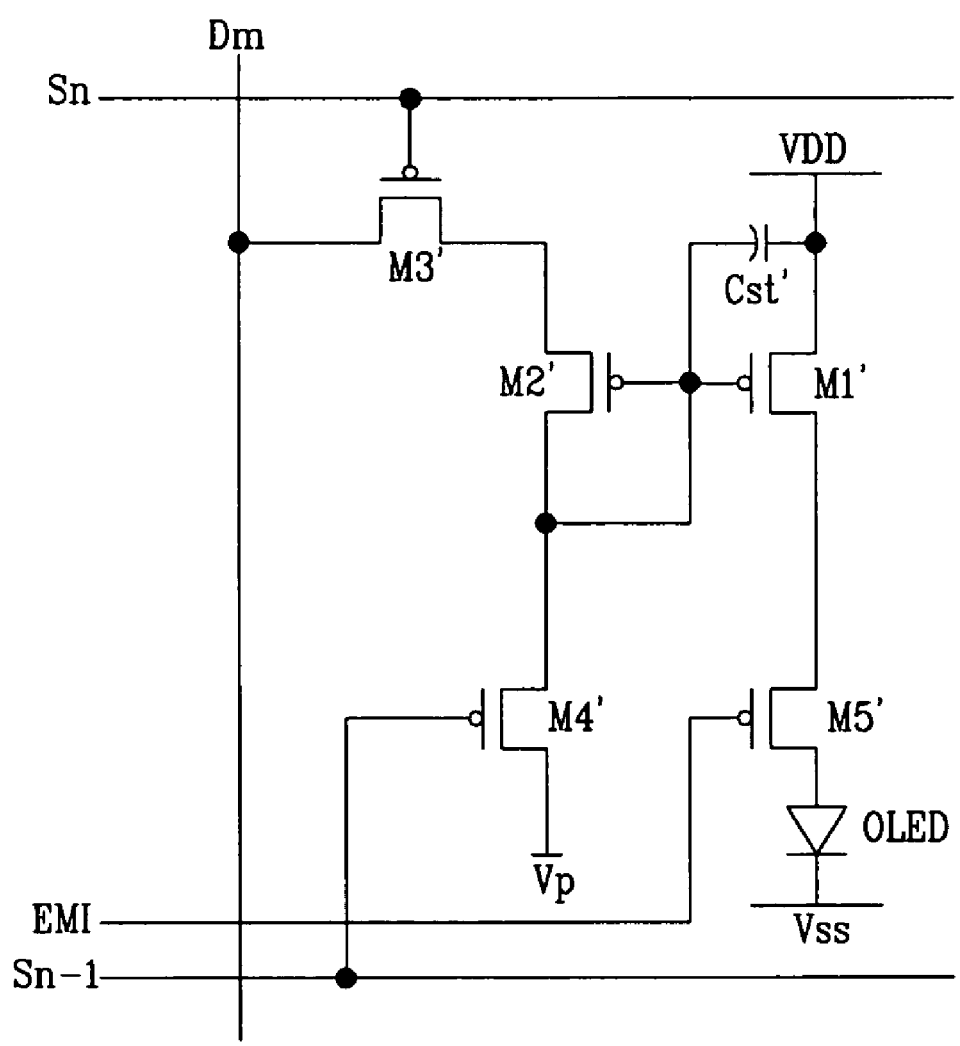
FIG. 7 is an equivalent circuit diagram of a pixel circuit according to a second exemplary embodiment of the present invention.
Figure 8:
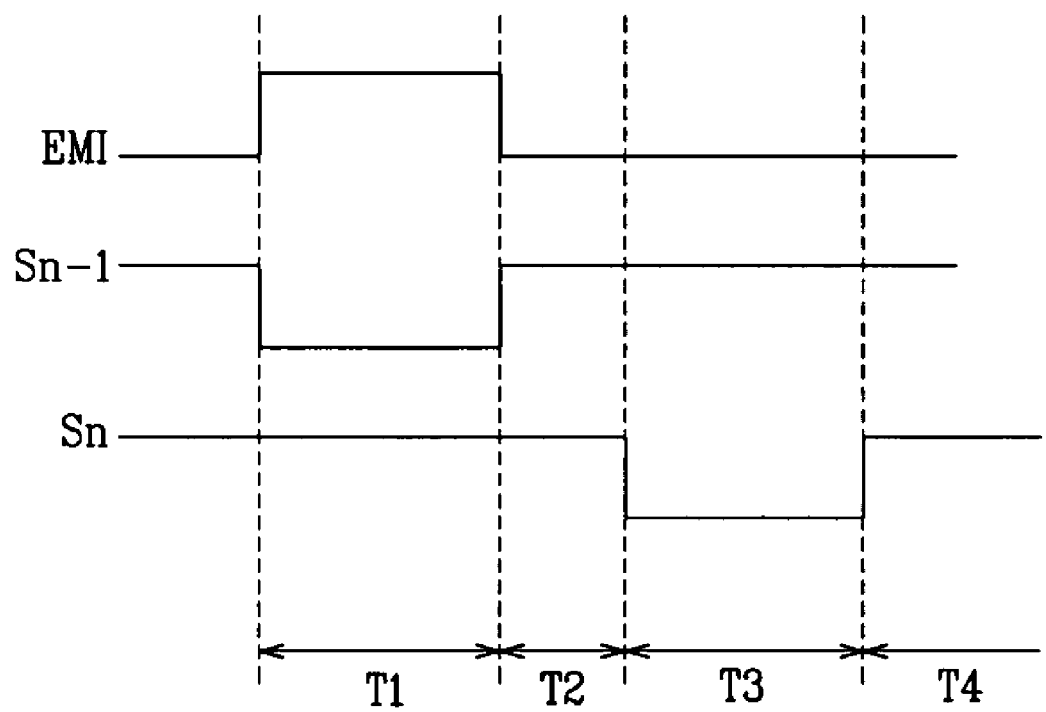
FIG. 8 is a diagram showing waveforms for driving the pixel circuit of FIG. 7.

FIG. 7 is an equivalent circuit diagram of a pixel circuit according to a second exemplary embodiment of the present invention, and FIG. 8 is a diagram showing waveforms for driving the pixel circuit shown in FIG. 7.

As shown in FIG. 7, the pixel circuit according to the second exemplary embodiment of the present invention has substantially the same equivalent circuit as that of the pixel circuit of the aforementioned first exemplary embodiment with the exception of the type of the transistor M5' (which replaces the transistor M5 of FIG. 3) and a control line EMI. Specifically, the transistor M5' is a PMOS transistor as are the transistors M1' to M4', and it is turned off in response to a high-level control signal from the control line EMI. The control signal applied to the control line EMI has the inverted form of the select signal from the previous scan line Sn–1, as shown in FIG. 8. Accordingly, the transistor M5' is turned off during the pre-charge period T1 so that current can be prevented from flowing through the organic EL element OLED as in the first exemplary embodiment.

In accordance with the second exemplary embodiment, a process of manufacturing the pixel circuit can be simplified more than that according to the first exemplary embodiment because the pixel circuit is constructed of only one type of transistors.

Next, a layout of pixels according to the second exemplary embodiment of the present invention is explained.

Figure 9:
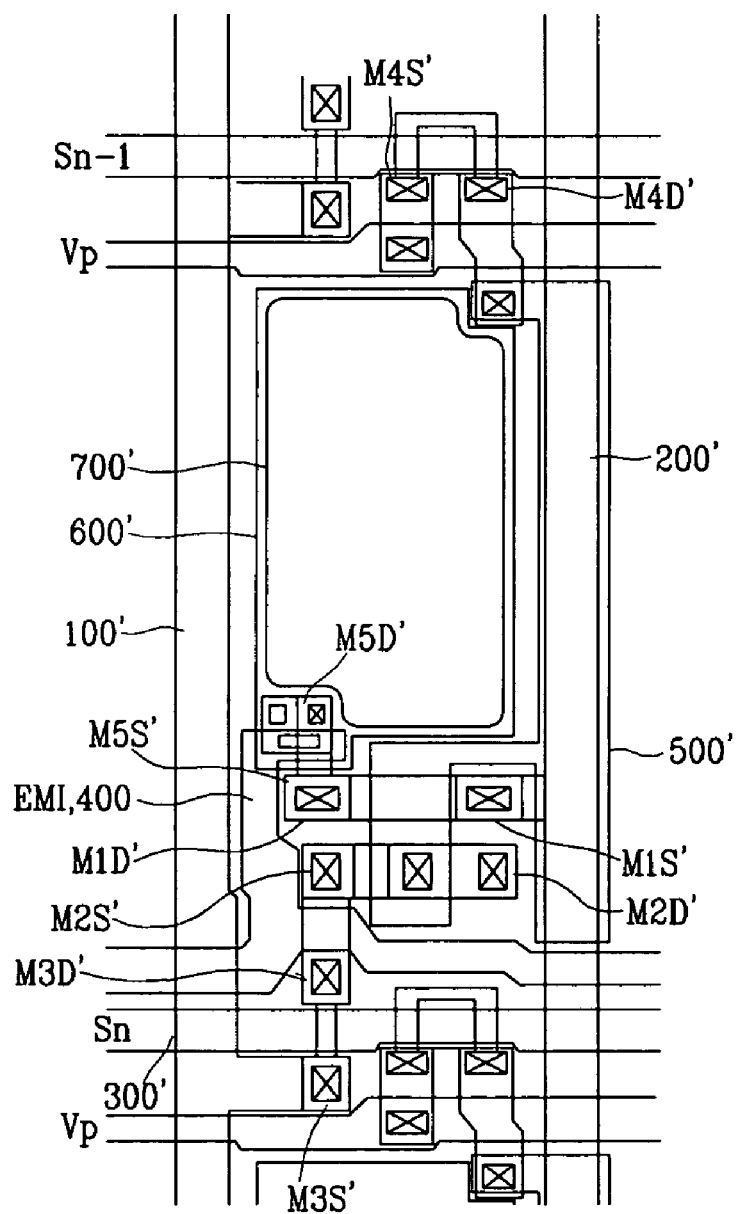
FIG. 9 shows a layout of an image display according to the second exemplary embodiment of the present invention.
Figure 10:
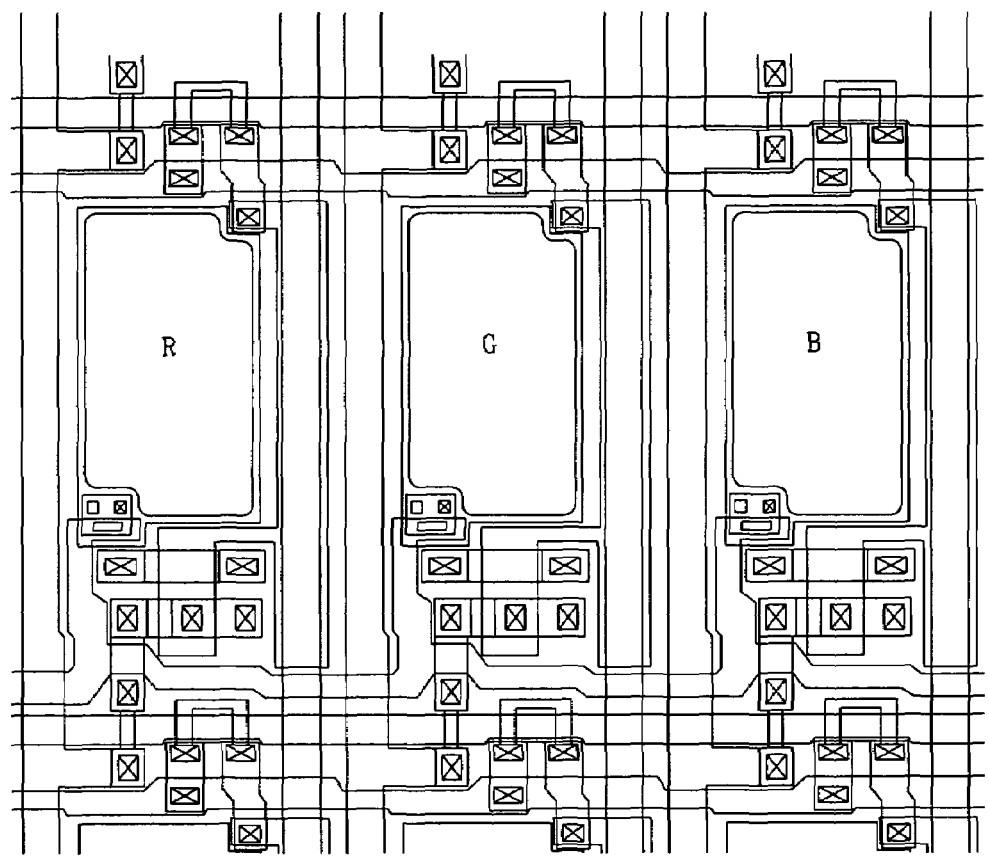
FIG. 10 shows a layout of R, G, and B pixels, each of which has the layout structure of FIG. 9.

FIG. 9 shows a layout of an image display according to the second exemplary embodiment of the present invention, and FIG. 10 shows a layout of R, G, and B pixels, each of which has the layout structure of FIG. 9.

Referring to FIGS. 9 and 10, a data line 100' is formed in a vertical direction, and a power supply line 200' is formed in parallel with the data line 100'. The data line 100' and the power supply line 200' are formed as a pair at every pixel. A scan line (Sn) 300' is formed in a horizontal direction, crossing the data line 100'.

A part of the data line 100' forms the source electrode M3S' of the switching transistor M3'. The source and drain electrodes M3S' and M3D' of the switching transistor M3' are respectively formed at both sides of the scan line Sn. The channel between the source and drain electrodes M3S' and M3D' is formed by the scan line Sn and is formed in parallel with the data line 100'. A source M4S' of the transistor M4' is coupled to the pre-charge voltage Vp, and a drain M4D' of the transistor M4' is coupled to the gate of the compensating transistor M2'.

The source electrode M2S' of the compensating transistor M2' is formed on the same line as the drain electrode M3D' of the switching transistor M3', and is coupled thereto. The drain electrode M2D' of the compensating transistor M2' is formed opposite to the source electrode M2S'. The channel between the source and drain electrodes M2S' and M2D' of the compensating transistor M2' is formed of a semiconductor layer in parallel with the scan line Sn.

The drain and source electrodes M1D' and M1S' of the driving transistor M1' are respectively formed opposite to the source and drain electrodes M2S' and M2D' of the compensating transistor M2'. The channel between the source and drain electrode M1S' and M1D' is also formed from a semiconductor layer in parallel with the scan line Sn. This channel of the driving transistor M1' is coupled to a sustain electrode line 500' to form a capacitor Cst', and the source electrode M1S' is coupled to the power supply line 200'.

The source electrode M5S' of the transistor M5' is coupled to the drain electrode M1D' of the driving transistor M1', and its drain electrode M5D' is coupled to a pixel electrode 600' through a contact hole. The gate electrode of the transistor M5' is coupled to a control line 400 (EMI). A planarization layer is formed on the pixel electrode 600', and an organic EL element layer 700' is formed thereon.

As described above, according to the first and second exemplary embodiments of the present invention, the channels of the mirror-type compensating transistor M2 (or M2') and the driving transistor M1 (or M1') are formed in parallel with the scan lines so that the compensating transistor M2 (or M2') and the driving transistor M1 (or M1') of each of R, G, and B pixels are located on the same line.

Figure 11:
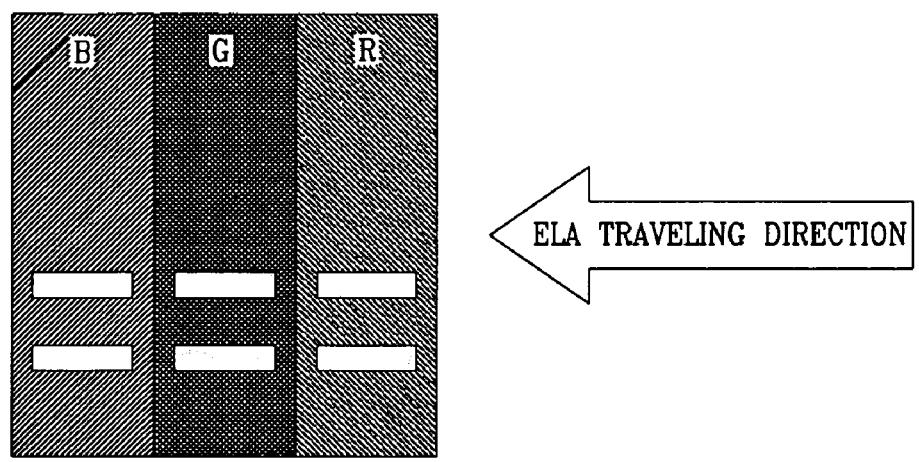
FIG. 11 shows the traveling direction of an Eximer laser used to manufacture the image display according to an exemplary embodiment of the present invention.

Accordingly, R, G, and B pixels are irradiated by the same Eximer laser beam if the traveling direction of the Eximer laser beam is aligned with shorter one of the vertical and horizontal sides of each pixel, that is, the direction parallel with the scan lines. FIG. 11 shows the traveling direction of the Eximer laser in the image display according to the exemplary embodiments of the present invention. As shown in FIG. 11, the compensating transistor M2 (or M2') and the driving transistor M1 (or M1') of each of R, G, and B pixels are located on the same line so that the same Eximer laser beam is irradiated on the compensating transistor M2 (or M2') and the driving transistor M1 (or M1') of each pixel when the Eximer laser beam is irradiated in the direction parallel with the scan lines.

The compensating transistor M2 (or M2') and driving transistor M1 (or M1') have substantially the same threshold voltage because they are manufactured under the same fabrication process conditions. As a result, an organic EL display with high gray can be realized because $V_{TH2}=V_{TH1}$.

The layout of the organic EL display in accordance with the above-mentioned embodiments is merely an example, and it can be modified in various ways.

The light emitting display device based on the voltage programming method has been described in the above-described embodiments, but the present invention is not restricted to the voltage programming method. Instead, the principles of the present invention may also be applied to the light emitting display device based on the current programming method including mirror-type transistors. Therefore, the data signals include the data voltage and the data current.

While this invention has been described in connection with certain exemplary embodiments, it is to be understood that the invention is not limited to the disclosed embodiments, but, on the contrary, is intended to cover various modifications included within the spirit and scope of the appended claims, and equivalents thereof.

According to the present invention, the driving transistor and the compensating transistor have substantially uniform characteristics. In particular, the two transistors have substantially the same threshold voltage so that a deviation in the threshold voltages of the transistors can be compensated. As a result, a high-gray display can be realized.

What is claimed is:

1. A display panel of an image display, which includes a plurality of data lines for transmitting a data signal corresponding to a video signal, a plurality of scan lines for transmitting a select signal, and a plurality of pixel circuits each of which is in a pixel region defined by two neighboring data lines and two neighboring scan lines, each said pixel circuit comprising:

a display element for displaying an image corresponding to an amount of a current applied thereto;

a first transistor having a capacitor coupled between a main electrode and a control electrode thereof, the first transistor being for outputting the current applied to the display element, the amount of the current corresponding to a voltage between the main electrode and the control electrode thereof;

a second transistor whose control electrode is coupled to the control electrode of the first transistor, the second transistor being diode-connected; and a first switching element coupled to a main electrode of the second transistor, the first switching element being for delivering the data signal from a corresponding said data line to the second transistor in response to the select signal from a current said scan line, wherein channels of the first and second transistors are elongated in an elongation direction that is substantially parallel to the scan lines, and wherein the channels of the first transistors of the pixel circuits that are adjacent to each other in the elongation direction are aligned with each other along a first line, and the channels of the second transistors of the pixel circuits that are adjacent to each other in the elongation direction are aligned with each other along a second line that is parallel to and spaced from the first line.

2. The display panel of claim 1, wherein each said pixel circuit further comprises a third transistor coupled between the control electrodes of the first and second transistors and a pre-charge voltage, wherein the third transistor applies the pre-charge voltage in response to the select signal from a previous said scan line, such that the capacitor is charged using the pre-charge voltage.

3. The display panel of claim 1, wherein the display element is an organic electroluminescent element.

4. The display panel of claim 1, wherein an irradiation direction of an Eximer laser irradiated to form the first and second transistors are substantially parallel with the scan lines.

5. A display panel of an image display, which includes a plurality of data lines for transmitting a data signal corresponding to a video signal, a plurality of scan lines for transmitting a select signal, and a plurality of pixel circuits each of which is in a pixel region defined by two neighboring data lines and two neighboring scan lines, each said pixel circuit comprising:

a display element for displaying an image corresponding to an amount of a current applied thereto;

a first transistor having a capacitor coupled between a main electrode and a control electrode thereof, the first transistor being for outputting the current applied to the display element, the amount of the current corresponding to a voltage between the main electrode and the control electrode thereof;

a second transistor whose control electrode is coupled to the control electrode of the first transistor, the second transistor being diode-connected; and a first switching element coupled to a main electrode of the second transistor, the first switching element being for delivering the data signal from a corresponding said data line to the second transistor in response to the select signal from a current said scan line, wherein channels of the first and second transistors are elongated in a direction that is substantially parallel to the scan lines, wherein each said pixel circuit further comprises a third transistor coupled between the control electrodes of the first and second transistors and a pre-charge voltage, wherein the third transistor applies the pre-charge voltage in response to the select signal from a previous said scan line, such that the capacitor is charged using the pre-charge voltage, and wherein each said pixel circuit further comprises a fourth transistor coupled between a second main electrode of the first transistor and the display element, wherein the fourth transistor is turned off while the capacitor is being charged using the pre-charge voltage, such that the current does not flow to the display element during pre-charging.

6. The display panel of claim 5, wherein the first, second and third transistors are of a first type while the fourth transistor is of a second type.

7. The display panel of claim 6, wherein the first, second and third transistors are PMOS transistors, and the fourth transistor is an NMOS transistor.

8. The display panel of claim 5, wherein a control electrode of the fourth transistor is coupled to the previous said scan line, and is turned off in response to the select signal of the previous said scan line.

9. The display panel of claim 5, wherein the first, second, third and fourth transistors are of a same type.

10. The display panel of claim 5, wherein the first, second, third and fourth transistors are PMOS transistors.

11. The display panel of claim 5, further comprising a plurality of control lines, each said control line corresponding to a row of the pixel circuits, wherein a control electrode of the fourth transistors is coupled to a corresponding said control line, and is turned off in response to a control signal of the corresponding said control line.

12. A display panel of an image display, which includes a plurality of data lines for transmitting a data signal corresponding to a video signal, a plurality of scan lines for transmitting a select signal, and a plurality of pixel circuits each of which is in a pixel region defined by two neighboring data lines and two neighboring scan lines, each said pixel circuit comprising:

a display element for displaying an image corresponding to an amount of a current applied thereto;

a first transistor having a capacitor coupled between a main electrode and a control electrode thereof, the first transistor being for outputting the current applied to the display element, the amount of the current corresponding to a voltage between the main electrode and the control electrode thereof;

a second transistor whose control electrode is coupled to the control electrode of the first transistor, the second transistor being diode-connected; and a first switching element coupled to a main electrode of the second transistor, the first switching element being for delivering the data signal from the data lines to the second transistor in response to the select signal from a current said scan line, wherein channels of the first and second transistors are elongated in an elongation direction that is substantially parallel to a shorter one of vertical and horizontal sides of the pixel region, and wherein the plurality of pixel circuits include red, green and blue pixel circuits, wherein the first transistors of the red, green and blue pixel circuits are aligned with each other along a first line, and wherein the second transistors of the red, green and blue pixel circuits are aligned with each other along a second line that is parallel to and spaced from the first line, such that a same Eximer laser can be applied to the first transistors of the red, green and blue pixel circuits, and the same Eximer laser can be applied to the second transistors of the red, green and blue pixel circuits, during fabrication of the display panel.

13. The display panel of claim 12, wherein each said pixel circuit further comprises a third transistor coupled between the control electrodes of the first and second transistors and a pre-charge voltage, wherein the third transistor applies the pre-charge voltage in response to the select signal from a previous said scan line, such that the capacitor is charged using the pre-charge voltage.

14. A display panel of an image display, which includes a plurality of data lines for transmitting a data signal corresponding to a video signal, a plurality of scan lines for transmitting a select signal, and a plurality of pixel circuits each of which is in a pixel region defined by two neighboring data lines and two neighboring scan lines, each said pixel circuit comprising:
   a display element for displaying an image corresponding to an amount of a current applied thereto;
   a first transistor having a capacitor coupled between a main electrode and a control electrode thereof, the first transistor being for outputting the current applied to the display element, the amount of the current corresponding to a voltage between the main electrode and the control electrode thereof;
   a second transistor whose control electrode is coupled to the control electrode of the first transistor, the second transistor being diode-connected; and
   a first switching element coupled to a main electrode of the second transistor, the first switching element being for delivering the data signal from the data lines to the second transistor in response to the select signal from a current said scan line,
   wherein channels of the first and second transistors are elongated in a direction substantially parallel to a shorter one of vertical and horizontal sides of the pixel region, and
   wherein each said pixel circuit further comprises:
      a third transistor coupled between the control electrodes of the first and second transistors and a pre-charge voltage, wherein the third transistor applies the pre-charge voltage in response to the select signal from a previous said scan line, such that the capacitor is charged using the pre-charge voltage; and
      a fourth transistor coupled between a second main electrode of the first transistor and the display element, wherein the fourth transistor is turned off while the capacitor is being charged using the pre-charge voltage, such that the current does not flow to the display element during pre-charging.

15. An image display comprising:
   a plurality of data lines for transmitting a data signal corresponding to a video signal;
   a plurality of scan lines for transmitting a select signal;
   a plurality of pixel circuits each of which is in a pixel region defined by two neighboring data lines and two neighboring scan lines, each said pixel circuit comprising a display element for displaying an image in response to an amount of a current applied thereto, a first transistor having a capacitor coupled between a main electrode and a control electrode thereof, the first transistor being for outputting the current applied to the display element, the amount of the current corresponding to a voltage between the main electrode and the control electrode thereof, a second transistor whose control electrode is coupled to the control electrode of the first transistor, the second transistor being diode-connected, and a first switching element coupled to a main electrode of the second transistor, the first switching element being for delivering the data signal from the data lines to the second transistor in response to the select signal from a current said scan line;
   a data driver for applying the data signal to the data lines; and
   a scan driver for applying the select signal to the scan lines,
   wherein channels of the first and second transistors are elongated in an elongation direction that is substantially parallel to the scan lines, and
   wherein the channels of the first transistors of the pixel circuits that are adjacent to each other in the elongation direction are aligned with each other along a first line, and the channels of the second transistors of the pixel circuits that are adjacent to each other in the elongation direction are aligned with each other along a second line that is parallel to and spaced from the first line.

16. The image display of claim 15, wherein an irradiation direction of an Eximer laser irradiated to form the first and second transistors are substantially parallel to the scan lines.

17. The display panel of claim 15, wherein each said pixel circuit further comprises a third transistor coupled between the control electrodes of the first and second transistors and a pre-charge voltage, wherein the third transistor applies the pre-charge voltage in response to the select signal from a previous said scan line, such that the capacitor is charged using the pre-charge voltage.

18. An image display comprising:
   a plurality of data lines for transmitting a data signal corresponding to a video signal;
   a plurality of scan lines for transmitting a select signal;
   a plurality of pixel circuits each of which is in a pixel region defined by two neighboring data lines and two neighboring scan lines, each said pixel circuit comprising a display element for displaying an image in response to an amount of a current applied thereto, a first transistor having a capacitor coupled between a main electrode and a control electrode thereof, the first transistor being for outputting the current applied to the display element, the amount of the current corresponding to a voltage between the main electrode and the control electrode thereof, a second transistor whose control electrode is coupled to the control electrode of the first transistor, the second transistor being diode-connected, and a first switching element coupled to a main electrode of the second transistor, the first switching element being for delivering the data signal from the data lines to the second transistor in response to the select signal from a current said scan line;
   a data driver for applying the data signal to the data lines; and
   a scan driver for applying the select signal to the scan lines,
   wherein channels of the first and second transistors are elongated in a direction that is substantially parallel to the scan lines,
   wherein each said pixel circuit further comprises a third transistor coupled between the control electrodes of the first and second transistors and a pre-charge voltage, wherein the third transistor applies the pre-charge voltage in response to the select signal from a previous said scan line, such that the capacitor is charged using the pre-charge voltage, and
   wherein each said pixel circuit further comprises a fourth transistor coupled between a second main electrode of the first transistor and the display element, wherein the fourth transistor is turned off while the capacitor is being charged using the pre-charge voltage, such that the current does not flow to the display element during pre-charging.

19. A display panel of an image display, which includes a plurality of data lines for transmitting a data signal corresponding to a video signal, a plurality of scan lines for transmitting a select signal, and a plurality of pixel circuits including red, green and blue pixel circuits, each of which is in a pixel region defined by two neighboring data lines and two neighboring scan lines, each said pixel circuit comprising:

a display element for displaying an image corresponding to an amount of a current applied thereto;

a first transistor having a capacitor coupled between a main electrode and a control electrode thereof, the first transistor being for outputting the current applied to the display element, the amount of the current corresponding to a voltage between the main electrode and the control electrode thereof;

a second transistor whose control electrode is coupled to the control electrode of the first transistor, the second transistor being diode-connected; and a first switching element coupled to a main electrode of the second transistor, the first switching element being for delivering the data signal from a corresponding said data line to the second transistor in response to the select signal from a current said scan line, wherein channels of the first and second transistors are elongated in an elongation direction that is substantially parallel to the scan lines such that an Eximer laser beam can be irradiated to form the first transistors and the second transistors of the red, green and blue pixel circuits when irradiated in the elongation direction, and wherein the channels of the first transistors of the red, green and blue pixel circuits are aligned with each other along a first line, and the channels of the second transistors of the red, green and blue pixel circuits are aligned with each other along a second line that is parallel to and spaced from the first line.

* * * * *